(12) United States Patent
Fan

(10) Patent No.: US 10,492,322 B1
(45) Date of Patent: Nov. 26, 2019

(54) ELECTRIC CLAMPING DEVICE FOR ELECTRONIC DEVICES

(71) Applicant: Eagle Fan, Hsinchu (TW)

(72) Inventor: Eagle Fan, Hsinchu (TW)

( * ) Notice: Subject to any disclaimer, the term of this patent is extended or adjusted under 35 U.S.C. 154(b) by 2 days.

(21) Appl. No.: 16/056,604

(22) Filed: Aug. 7, 2018

(51) Int. Cl.
| | |
|---|---|
| *F16B 2/12* | (2006.01) |
| *H05K 7/14* | (2006.01) |
| *H05K 5/00* | (2006.01) |
| *H03K 17/96* | (2006.01) |
| *H01R 33/945* | (2006.01) |

(52) U.S. Cl.
CPC ............ *H05K 7/1401* (2013.01); *F16B 2/12* (2013.01); *H03K 17/96* (2013.01); *H05K 5/0017* (2013.01); *H01R 33/945* (2013.01)

(58) Field of Classification Search
USPC ......... 248/441.1, 447, 444, 442.2, 448, 451, 248/229.2, 229.22, 229.24, 316.4, 316.6; 269/216, 218, 89, 92, 93, 97, 107, 136, 269/146, 152, 153, 210, 212; 361/679.56, 361/679.55
See application file for complete search history.

(56) References Cited

U.S. PATENT DOCUMENTS

| | | | |
|---|---|---|---|
| 10,259,400 B1 * | 4/2019 | Song | B60R 11/0241 |
| 2014/0263931 A1 * | 9/2014 | Chen | F16M 11/041 248/576 |
| 2018/0252358 A1 * | 9/2018 | Yang | F16M 13/00 |
| 2018/0279809 A1 * | 10/2018 | Regan | A47F 7/0246 |
| 2019/0249697 A1 * | 8/2019 | Liu | F16B 2/12 |

* cited by examiner

*Primary Examiner* — Alfred J Wujciak
(74) *Attorney, Agent, or Firm* — Lin & Associates Intellectual Property, Inc.

(57) ABSTRACT

An electric clamping device includes: a main body; a clamping unit, a driving unit, a control unit, a carrier, a restoration spring and a triggering unit. The clamping unit clamps two sides of a mobile phone. When no external pressure is applied on the carrier, the restoration spring retains the carrier at its initial position such that pressing a bottom of the mobile phone against the carrier causes limited downward movement of the carrier with respect to the main body and results in transmitting a signal by triggering the trigger unit to the control unit and activating the driving unit, thereby driving the clamping unit from an initial position to an open position such that the two opposite sides of the mobile phone is clamped when the clamping unit retrieves to the initial position by virtue of a spring force.

7 Claims, 8 Drawing Sheets

ELECTRIC CLAMPING DEVICE FOR ELECTRONIC DEVICES

BACKGROUND OF THE INVENTION

1. Field of the Invention

The present invention relates to a technical field of electric clamping devices, in particular an electric clamping device for an electronic device, such as a mobile phone.

2. The Prior Arts

With the advancement of technology, mobile phones are prevalent for common people. In some environments, it is still recommended to use a hands-free device to hold the mobile phone, which is safer, such as in a car. A conventional hands-free device mainly includes a spring to drive the clamping component or is fixed, and the user has to apply force to operate the device, thereby causing inconvenience to the users. Some manufacturers have designed electric clamping devices that use motors to drive a gear set to manipulate the clamping components for clamping or opening. Some models even use sensor assistance to achieve an automatic opening, but when the user wants to remove the phone from the device, a switch must be touched by hand to allow the clamping assembly to be reopened. However, after the hands-free device is used to hold the mobile phone, the position of the switch is often concealed, so that the user does not easily see or can touch the switch, and the operation is somewhat inconvenient. In view of this, the applicant has designed an electric clamping device to solve this problem.

SUMMARY OF THE INVENTION

A primary objective of the present invention is to provide an electric clamping device that is designed to be automatically clamped or loosened by a user's one-handed pressure.

An electric clamping device of the present invention includes: a main body, a clamping unit, a driving unit, a control unit, a carrier, a restoration spring and a triggering unit. The clamping unit is disposed on the main body, includes a first clamping arm and a second clamping arm movable relative to each other from an initial position to an open position in such a manner that the first and second clamping arms retrieve to the initial position after reaching the opening position by virtue of a spring force. The driving unit is installed on the main body for driving the first and second clamping arms relative to each other so as to dispose the first and second clamping arms at the open position. The control unit is installed on the main body and is coupled electrically with the driving unit and is capable of controlling a performance mode and/or timing of the driving unit. The carrier is installed on the main body and is movable limitedly on the main body. The restoration spring is installed on the main body and is further coupled with the carrier in such a manner that the restoration spring retains the carrier at its initial position when no external force is applied on the carrier. The triggering unit is installed on the main body and is further coupled with the control unit in such a manner that an external force applied on the carrier causes contact between the carrier and the triggering unit and hence results in activation of the driving unit by the control unit, thereby driving the clamping unit to dispose the first and second clamping arms at the open position.

When a user wants to use the clamping device of the present invention, he or she must firstly press the carrier with the mobile phone downward such that the clamping unit can be automatically opened, and then the mobile phone can be clamped before the clamping arms being retrieved to their initial position. To remove the mobile phone, the device also operates in the same mode, thereby providing convenience to the user.

Preferably, the first clamping arm and the second clamping arm are L-shaped, and are disposed opposite to each other and are partially installed in the main body so that the first and second clamping arms can stably approach or move away from each other without detaching from the main body. The first clamping arm further has a first abutment plate that is disposed within the main body and that is biased by a first spring element so that the first clamping arm possesses a clamping force. The second clamping arm further has a second abutment plate that is disposed within the main body and that is biased by a second spring element so that the second clamping arm possesses a clamping force.

Preferably, the driving unit includes a motor, a toothed gear driven by the motor, a first push block having a first rack bar meshed with a bottom part of the toothed gear and a second push block having a second rack bar meshed with a top part of the toothed gear in such a manner that rotation of the toothed gear results in movement of the first and second push blocks toward and/or away from each other at different elevations, wherein the first push block is in contact with the first abutment plate of the first clamping arm while the second push block is in contact with the second abutment plate of the second clamping arm.

In one embodiment, the control unit includes a control printed circuit board coupled electrically with the driving unit and the triggering unit, and further has a connector consisting of a USB male and/or female for electrical connection with an external power source so as to provide power to an interior of the clamping device of the present invention.

In one embodiment of the present invention, the triggering unit includes a touch switch provided with two metal springs, which upon being pressed transits a signal to the control unit for activating and/or deactivating the driving unit.

In one embodiment of the present invention, the main body includes a rear half formed with a guide slot. The carrier is disposed within the main body and includes at least one lift tongue exposed from a bottom part of the main body, an L-shaped connecting portion defining an elongated slot in alignment with the guide slot and having a pair of one way tooth at both sides of the elongated slot, a movable post with a diameter smaller than that of the guide slot so as to permit movably extension through the guide slot and the elongated slot of the connecting portion, the movable post being formed with left and right convex teeth and defining an axial chamber to receive a third spring element therein in such a manner that when no external force is applied on the carrier, the left and right convex teeth of the movable post are meshed with the pair of one way tooth of the connecting portion.

Preferably, the restoration spring has a first end coupled to the main body at one position thereof and a second end coupled to the movable post in such a manner that when no external force is applied on the carrier, the left and right convex teeth of the movable post mesh with the pair of one way tooth of the connecting portion, thereby disposing the carrier at its initial position.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
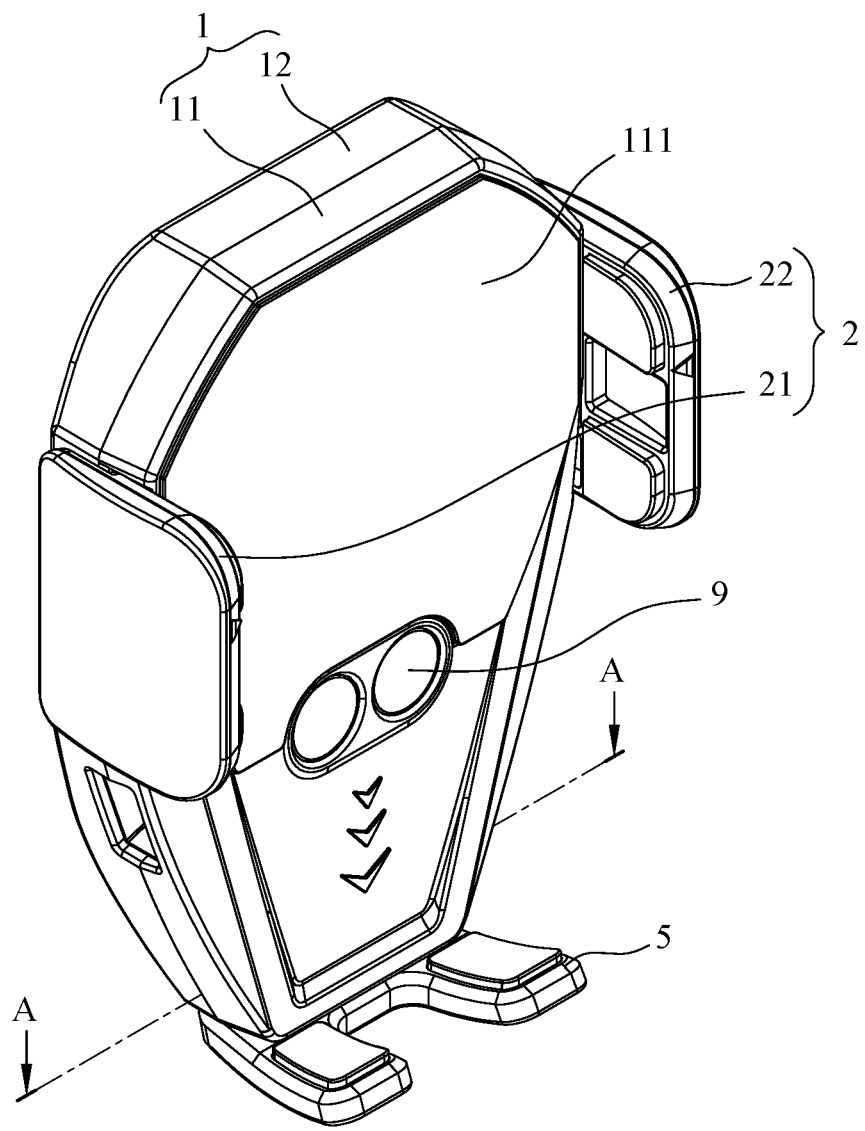
FIG. 1 is a perspective view of an electric clamping device of the present invention.
Figure 2:
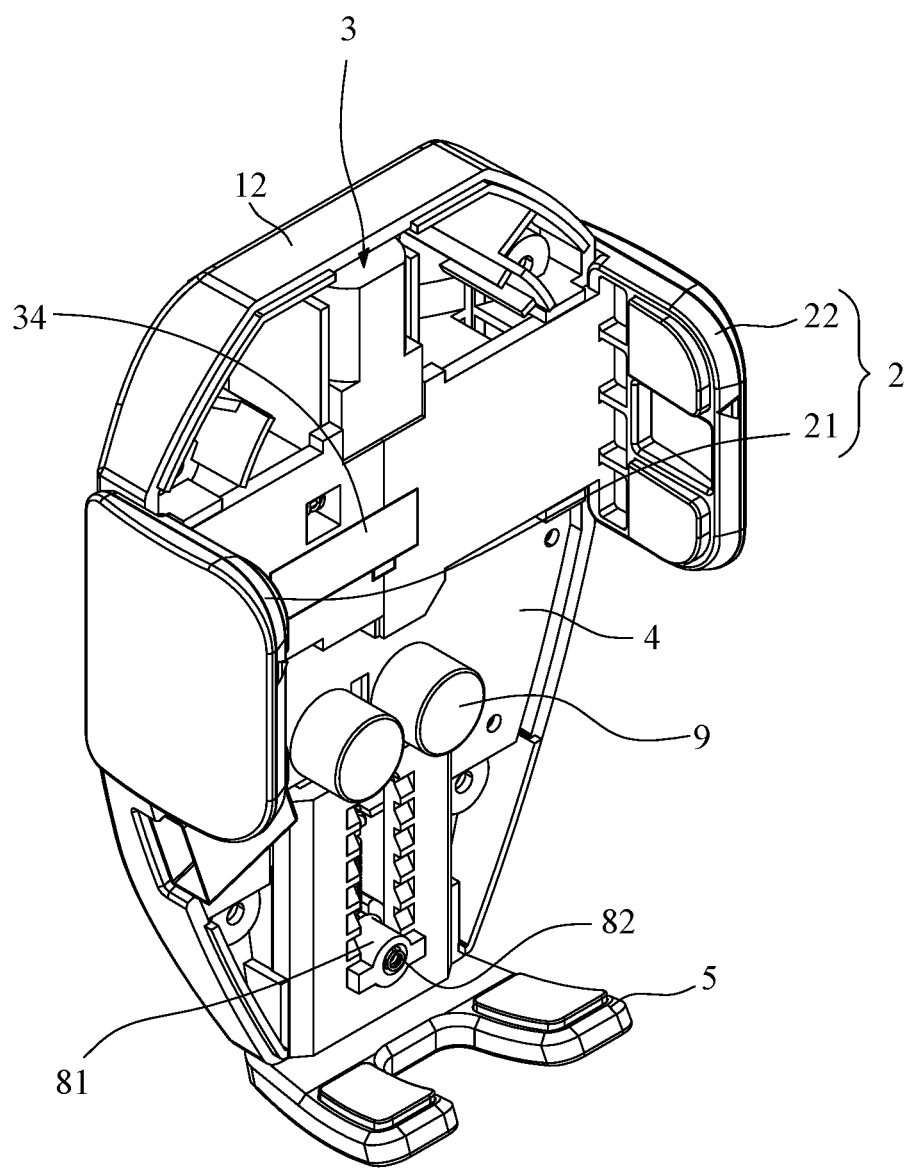
FIG. 2 is a perspective view of the electric clamping device of the present invention with the front cover removed to illustrate an interior thereof.
Figure 3:
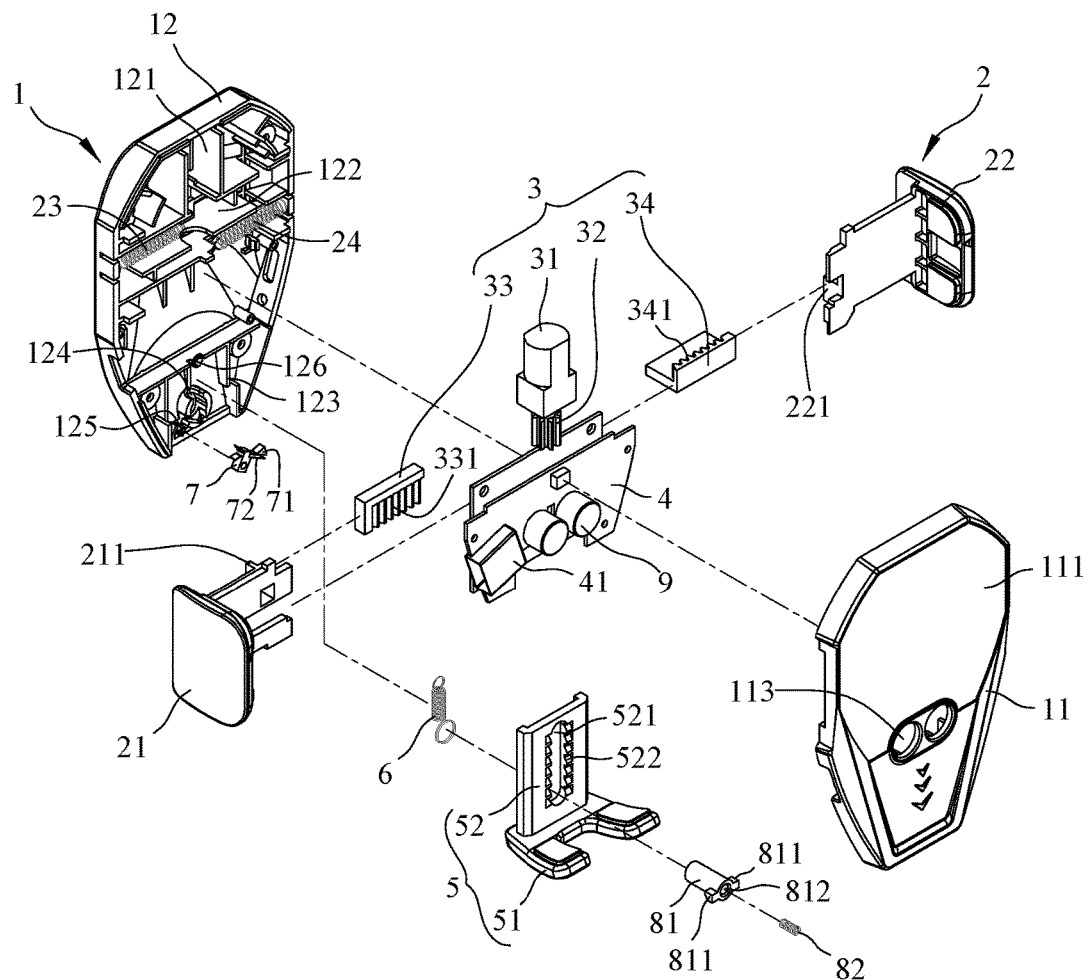
FIG. 3 is an exploded view of the electric clamping device of the present invention.

Referring to FIGS. 1-3, wherein FIG. 1 is a perspective view of an electric clamping device of the present invention; FIG. 2 is a perspective view of the electric clamping device of the present invention with the front cover removed to illustrate an interior thereof; and FIG. 3 is an exploded view of the electric clamping device of the present invention. As illustrated, the clamping electric of the present invention includes: a main body 1, a clamping unit 2, a driving unit 3, a control unit 4, a carrier 5, a restoration spring 6 and a triggering unit 7. The clamping unit 2 includes a first clamping arm 21 and a second clamping arm 22 such that when a user wants his mobile phone to be clamped by the clamping device of the present invention, the bottom part of the mobile phone is pressed against the carrier 5, which action will trigger the triggering unit 7 such that the control unit 4 activates the driving unit 3, thereby driving the clamping unit 2 from an initial position to an open position, where the mobile phone is clamped resiliently by the first and second clamping arms 21, 23 by virtue of a spring force once the user push his mobile phone against the clamping device. In the same manner, when the user wants to remove the mobile phone from the device, the bottom part of the mobile phone is pressed again against the carrier 5, which action will trigger the triggering unit 7 such that the control unit 4 activates the driving unit 3, thereby driving the clamping unit 2 from an initial position to an open position, where the user can easily remove the mobile phone from the carrier 5. An important aspect to note that the user does not need to touch any other switch for removing the mobile phone. In other words, only a single hand is required for disposing the mobile phone on or removing from the clamping device of the present invention.

A detailed description is explained in the following paragraphs.

The main body 1 includes a rear half 12 and a front half 11 coupled with the rear half 12 to define a receiving chamber therebetween to install all the elements mentioned above. The front half 11 has a reception surface 111 upon which the mobile phone can be disposed (see FIG. 8). The rear half 12 has a plurality of compartments for receiving all the elements, for instance, a first compartment 121 for installing the driving unit 3; a slide compartment 122 for installing the first and second clamping arms 21, 22 movable relative to each other from an initial position to an open position by the first and second spring elements 23, 24 in such a manner that the first and second clamping arms 21, 22 retrieve to the initial position after reaching the opening position by virtue of a spring force of the first and second spring elements 23, 24; a guide frame 123 for installing the carrier 5 therein and defining a guide slot 124, the purpose of which will be described later.

As a matter of fact, the driving unit 3 is installed on the main body 1 for driving the first and second clamping arms 21, 22 relative to each other so as to dispose the first and second clamping arms 21, 22 at the open position and to retrieve to their initial position after reaching the open position by virtue of the spring force. To be more specific, the first clamping arm 21 and the second clamping arm 22 are L-shaped, and are disposed opposite to each other and are partially installed in the main body 1 and are partially exposed to two opposite sides of the reception surface 111 so that the first and second clamping arms 21, 22 can stably approach or move away from each other without detaching from the main body 1. The first clamping arm 21 further has a first abutment plate 211 that is disposed within the main body 1 and that is biased by the first spring element 23 so that the first clamping arm 21 possesses a clamping force. The second clamping arm 22 further has a second abutment plate 221 that is disposed within the main body 1 and that is biased by the second spring element 24 so that the second clamping arm possesses a clamping force.

Figure 4:
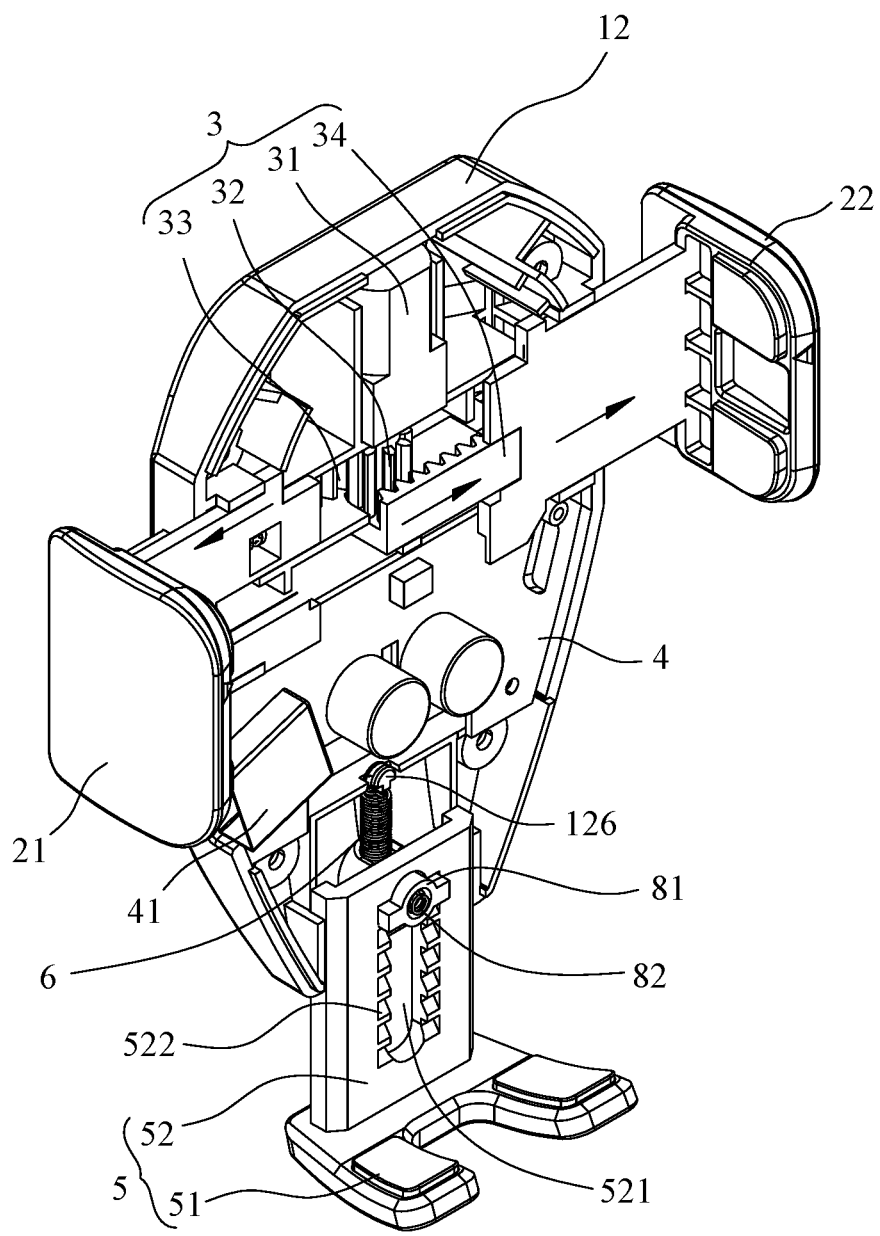
FIG. 4 shows the electric clamping device of the present invention, wherein first and second clamping arms are moved from an initial position to an open position.

The driving unit 3 is installed in the main body 1 for driving the first and second clamping arms 21, 22 relative to each other so as to dispose the first and second clamping arms 21, 22 at the open position. The driving unit 3 generally includes a motor 31, a toothed gear 32 driven by the motor 31, a first push block 33 having a first rack bar 331 meshed with a bottom part of the toothed gear 32 and a second push block 34 having a second rack bar 341 meshed with a top part of the toothed gear 32 in such a manner that rotation of the toothed gear 32 results in movement of the first and second push blocks 33, 34 toward and/or away from each other at different elevations (see FIG. 4), wherein the first push block 33 is in contact with the first abutment plate 211 of the first clamping arm 21 while the second push block 34 is in contact with the second abutment plate 221 of the second clamping arm 22.

In this embodiment, activation of the driving unit 3 results in movement of the first and second clamping arms 21, 22 to the open position. After reaching the open position, the first and second clamping arms 21, 22 retrieve to their initial position by virtue of biasing force of the first and second spring elements 23, 24. To be more specific, a performance mode and/or timing of the driving unit 3 can be configured in such a manner that the driving unit 3 rotates in the clockwise direction for a predetermined circles and stops for an interval, where the first and second clamping arms 21, 23 are moved away from each other to the open position (see FIG. 4). In case, the driving unit 3 rotates in an anti-clockwise direction for the predetermined circles, the first and second push blocks 33, 34 move toward each other, which, in turn, cause the first and second clamping arms 21, 22 to move from the open position back to the initial position. Owing to these facts, the mobile phones of different sizes can be clamped by the first and second clamping arms 21, 22.

The control unit 4 is installed in the main body 1 and is coupled electrically with the driving unit 3 and can control the performance mode and/or timing of the driving unit 3. Preferably, the control unit 4 includes a control printed circuit board coupled electrically with the driving unit 3 and the triggering unit 7. The control unit 4 further has a connector consisting of a USB male and/or female for electrical connection with an external power source so as to provide power to an interior of the clamping device of the present invention.

The carrier 5 is installed in the main body 1 and is movable limitedly on the main body 1 so as to contact with the triggering unit 7 such that upon removal of the applied external force, the carrier 5 retrieves to its initial position by virtue of the restoration spring 6. Preferably, the restoration spring 6 is installed on the main body 1 and is coupled with the carrier 5 in such a manner that the restoration spring 6 retains the carrier 5 at its initial position when no external force is applied on the carrier 5. The initial position is located adjacent to the clamping unit 2. To be more specific, the restoration spring 6 has a first end coupled at one position thereof, like a fixing stem 126 in the rear half 12 of the main body 1 and a second end coupled to the carrier 5 such that downward pressing of the carrier 5 by the bottom part of the mobile phone causes limited movement of the carrier 5 relative to the main body 1 and contact the triggering unit 7. Note the restoration of the spring 6 is greater than the downward pressing of the mobile phone.

The triggering unit 7 includes a touch switch that is installed on the main body 1 and that is provided with two metal springs 71, 72 which upon compressed generates and transmits a signal to the control unit 4. In this embodiment, the triggering unit 7 is mounted on a fixing seat 125 in the rear half 12 and is coupled electrically with the control unit 4 adjacent to the carrier 5.

The carrier 5 is movable limitedly, such as 1-3 mm, relative to the main body 1, and is suitable a particular size of the mobile phone.

However, in order to receive mobile phones of different specifications or sizes, the vertical moving length of the carrier 5 can be adjusted in the present invention. The rear half 12 is preferably formed with a guide slot 124. The carrier 5 is installed within the main body 1, includes at least one lift tongue 51 exposed from a bottom part of the main body 1, an L-shaped connecting portion 52 defining an elongated slot 521 in alignment with the guide slot 124 and having a pair of one way tooth 522 at both sides of the elongated slot 521, a movable post 81 with a diameter L2 (see FIG. 6) smaller than that of the width L1 the guide slot 124 so as to permit movably extension through the guide slot 124 and the elongated slot 521 of the connecting portion 52, the movable post 81 being formed with left and right convex teeth 811 and defining an axial blind chamber 812 to receive a third spring element 82 therein in such a manner that when no external force is applied on the carrier 5, the left and right convex teeth 811 of the movable post 81 are meshed with the pair of one way tooth 522 of the connecting portion 52, thereby retaining the carrier 5 at its initial position.

Figure 5:
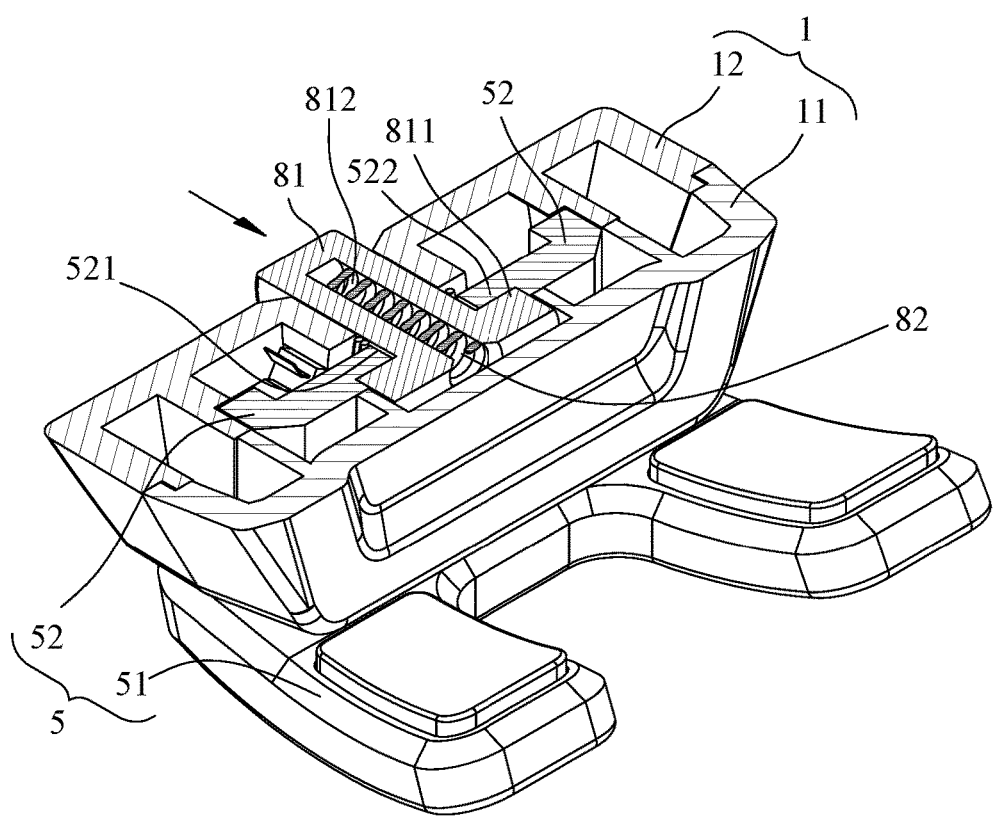
FIG. 5 shows a cross-sectional view of the electric clamping device of the present invention taken along Line A-A in FIG. 1.
Figure 6:
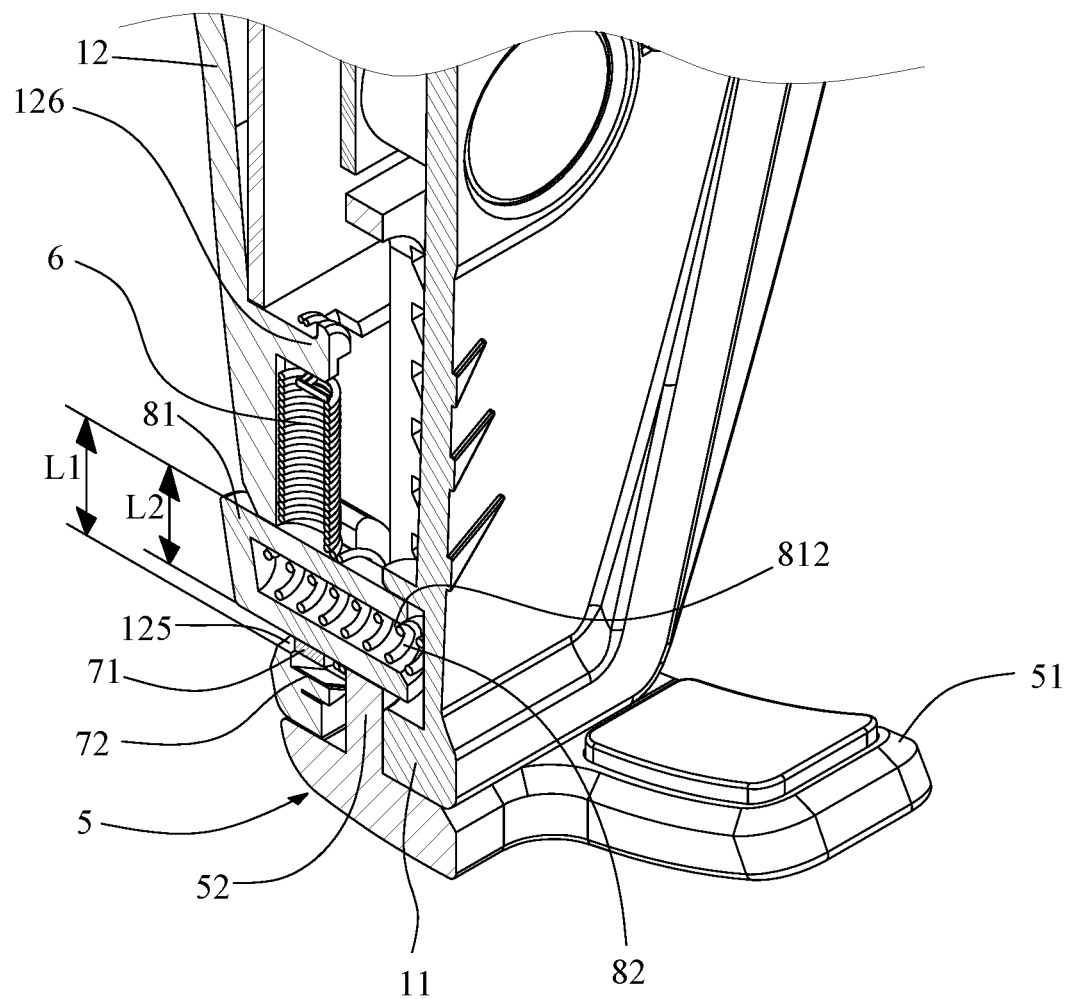
FIG. 6 shows a fragmentary and enlarged cross-sectional view of the electric clamping device of the present invention to illustrate the position of a movable post employed therein.
Figure 7:
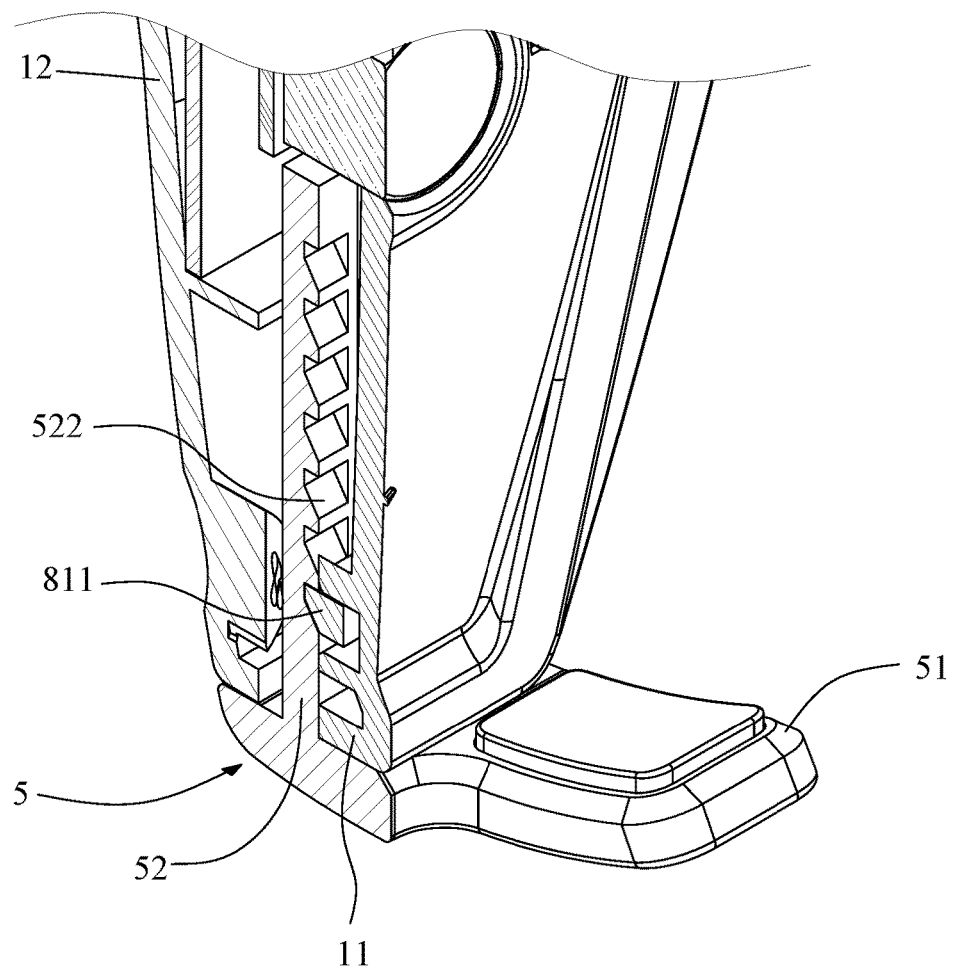
FIG. 7 shows another fragmentary and enlarged cross-sectional view of the electric clamping device of the present invention to illustrate the connection between the movable post and a carrier employed therein.

Referring to FIGS. 5, 6 and 7, after assembly of the clamping device of the present invention, a portion of the movable post 81 is exposed to an exterior surface of the rear half 12 (opposite to the reception surface 111 of the front half 11) while the left and right convex teeth 811 of the movable post 81 are meshed with the pair of one way tooth 522 of the connecting portion 52 and at the same time the movable post 81 contacts the triggering unit 7 and separates the two metal springs 71, 72 relative to each other. Under this condition, since no external force is applied on the carrier 5, the carrier 5 is disposed at its initial position. In other words, the bottom part of the carrier 5 is exposed from the main body 1 by a predetermined length, which means that the clamping device of the present invention can clamp a mobile phone of particular size or specification.

Referring to FIG. 5 again, in the event that the user wishes to clamp mobile phones of different sizes or specifications. The user must first of all adjust the exposing length of the bottom part of the carrier 5. To achieve the adjustment, he must push the movable post 81 against biasing action of the third spring element 82 from an exterior of the rear half 12 of the main body 1 in the arrow direction as best shown in FIG. 5, which action can result in disengagement of the left and right convex teeth 811 of the movable post 81 from the pair of one way tooth 522 of the connecting portion 52 of the carrier 5 so that the carrier 5 can be pressed downward to alter the exposed length of the lift tongue 51 from the main body 1. Upon removal of the pressure, the left and right convex teeth 811 of the movable post 81 mesh again with the pair of one way tooth 522 of the connecting portion 52 of the carrier 5. In rear application, the adjusting length of the carrier 5 ranges from 1 to 3 mm only since the top part of the front half 11 is open upward to facilitate mounting of mobile phones of different sizes.

Figure 8:
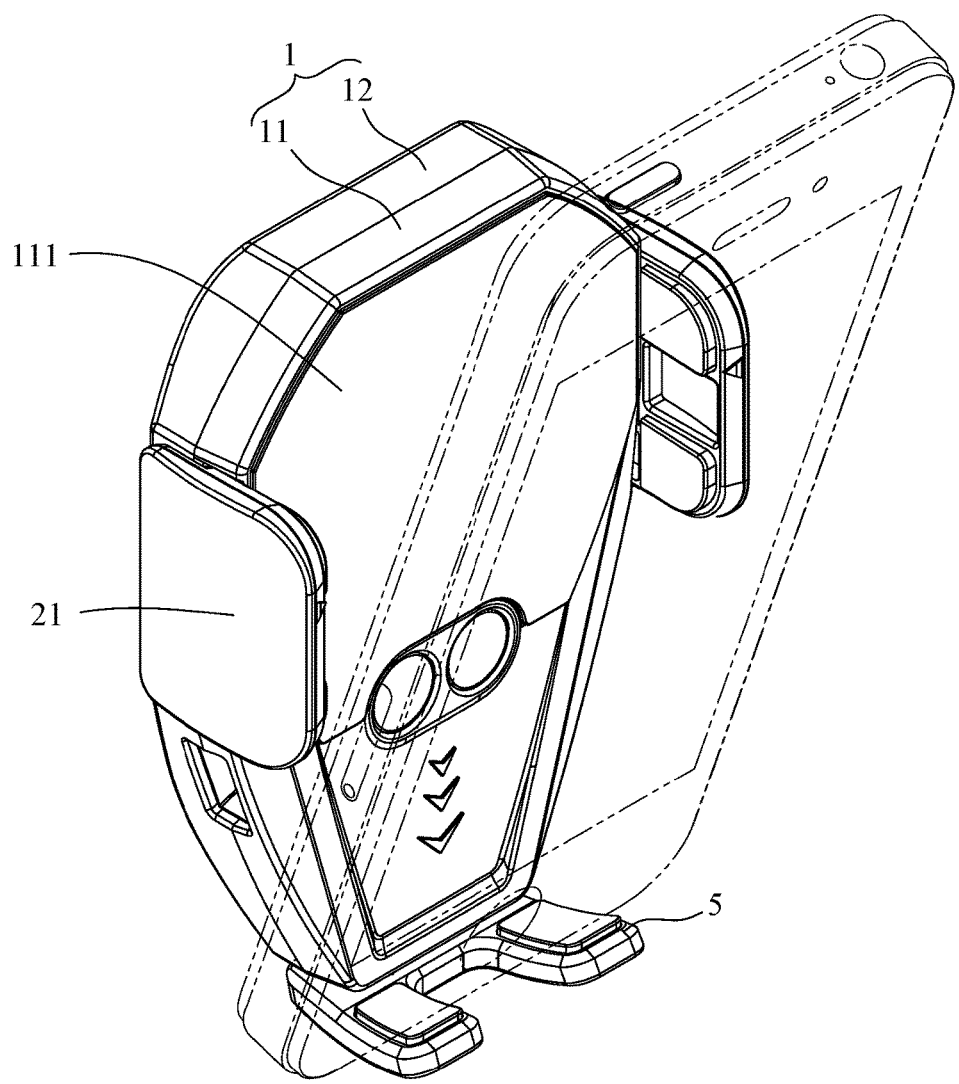
FIG. 8 shows the electric clamping device of the present invention in application.

As best shown in FIG. 8, in the normal application and when the mobile phone user wishes his mobile phone to be clamped by the clamping device of the present invention, the mobile phone is pressed against the lift tongue 51 of the carrier 5 by a force slightly greater than the restoration force of the spring 6, which action will trigger the triggering unit 7 (causes two metal springs 71, 72 touch each other and slightly moving the movable post 81 downward along the elongated slot 521) such that the control unit 4 activates the driving unit 3, thereby driving the clamping unit 2 from an initial position to an open position, where the mobile phone is clamped resiliently by the first and second clamping arms 21, 23 by virtue of a spring force the first and second spring elements 23, 24. In the same manner, when the user wants to remove the mobile phone from the device, the bottom part of the mobile phone is pressed again against the carrier 5, which action will trigger the triggering unit 7 such that the control unit 4 activates the driving unit 3, thereby driving the clamping unit 2 from an initial position to an open position, where the user can easily remove the mobile phone from the carrier 5. Note that the user does not need to touch any other switch for removing the mobile phone. In other words, only a single hand is required for disposing the mobile phone on or removing from the clamping device of the present invention.

Another aspect to note is that in the present invention, a radar microwave sensor can be applied in order to move the clamping unit 2 from its initial position to an open position. As best shown in FIGS. 1-3, the front half 11 is preferably formed with a mounting hole 113 for installing two radar microwave sensors 9 which are coupled electrically with the control unit 4. In this embodiment, the radar microwave sensors 9 are installed on the control 4 such that the sensors 9 transmit a signal to the control unit 4 upon sensing an approach of the mobile phone toward the same, thereby driving the clamping unit 2 from its initial position to the open position. The removal of the mobile phone from the clamping device is the same as described above.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An electric clamping device for supporting a portable electronic device, comprising
   a main body;
   a clamping unit disposed on the main body, including a first clamping arm and a second clamping arm movable relative to each other from an initial position to an open position in such a manner that the first and second clamping arms retrieve to the initial position after reaching the opening position by virtue of a spring force, wherein the first clamping arm and the second clamping arm retain the portable electronic device on the main body;
   a driving unit installed on the main body for driving the first and second clamping arms relative to each other so as to dispose the first and second clamping arms at the open position;
   a control unit installed on the main body and coupled electrically with the driving unit and capable of controlling a performance mode and/or timing of the driving unit;
   a carrier installed on the main body and being movable limitedly on the main body, wherein the carrier supports the bottom of the portable electronic device;
   a restoration spring installed on the main body and coupled with the carrier in such a manner that the restoration spring retains the carrier at its initial position when no external force is applied on the carrier; and
   a triggering unit installed on the main body and coupled with the control unit in such a manner that an external force applied on the carrier causes contact between the carrier and the triggering unit and hence results in activation of the driving unit by the control unit, thereby driving the clamping unit to dispose the first and second clamping arms at the open position.

2. The electric clamping device according to claim 1, wherein the first clamping arm and the second clamping arm are L-shaped, and are disposed opposite to each other and partially installed in the main body so that the first and second clamping arms can stably approach or move away from each other without detaching from the main body, the first clamping arm further has a first abutment plate that is disposed within the main body and that is biased by a first spring element so that the first clamping arm possesses a clamping force, the second clamping arm further has a second abutment plate that is disposed within the main body and that is biased by a second spring element so that the second clamping arm possesses a clamping force.

3. The electric clamping device according to claim 2, wherein the driving unit includes a motor, a toothed gear driven by the motor, a first push block having a first rack bar meshed with a bottom part of the toothed gear and a second push block having a second rack bar meshed with a top part of the toothed gear in such a manner that rotation of the toothed gear results in movement of the first and second push blocks toward and/or away from each other at different elevations, wherein the first push block is in contact with the first abutment plate of the first clamping arm while the second push block is in contact with the second abutment plate of the second clamping arm.

4. The electric clamping device according to claim 1, wherein the control unit is a control printed circuit board coupled electrically with the driving unit and the triggering unit, the control unit further has a connector consisting of a USB male and/or female.

5. The electric clamping device according to claim 1, wherein the triggering unit is a touch switch.

6. The electric clamping device according to claim 1, wherein the main body includes a rear half formed with a guide slot, the carrier being disposed within the main body and includes at least one lift tongue exposed from a bottom part of the main body, an L-shaped connecting portion defining an elongated slot in alignment with the guide slot of the rear half and having a pair of one way tooth at both sides of the elongated slot, a movable post with a diameter smaller than that of the guide slot so as to permit movably extension through the guide slot and the elongated slot of the connecting portion, the movable post being formed with left and right convex teeth and defining an axial blind chamber to receive a third spring element therein in such a manner that when no external force is applied on the carrier, the left and right convex teeth of the movable post are meshed with the pair of one way tooth of the connecting portion.

7. The electric clamping device according to claim 1, wherein the restoration spring has a first end coupled to the main body at one position thereof and a second end coupled to the movable post in such a manner that when no external force is applied on the carrier, the left and right convex teeth of the movable post are meshed with the pair of one way tooth of the connecting portion, thereby disposing the carrier at its initial position.

* * * * *